United States Patent
Oyamada et al.

(10) Patent No.: US 7,598,668 B2
(45) Date of Patent: Oct. 6, 2009

(54) ORGANIC SEMICONDUCTOR DEVICE AND METHOD FOR MANUFACTURING SAME

(75) Inventors: Takahito Oyamada, Chitose (JP); Chihaya Adachi, Chitose (JP)

(73) Assignees: Kyoto University, Kyoto (JP); Pioneer Corporation, Tokyo (JP); Hitachi, Ltd., Tokyo (JP); Mitsubishi Chemical Corporation, Tokyo (JP); Rohm Co., Ltd., Kyoto (JP)

( * ) Notice: Subject to any disclaimer, the term of this patent is extended or adjusted under 35 U.S.C. 154(b) by 236 days.

(21) Appl. No.: 10/569,807

(22) PCT Filed: Aug. 25, 2004

(86) PCT No.: PCT/JP2004/012586

§ 371 (c)(1),
(2), (4) Date: Feb. 27, 2006

(87) PCT Pub. No.: WO2005/022589

PCT Pub. Date: Mar. 10, 2005

(65) Prior Publication Data

US 2007/0024179 A1    Feb. 1, 2007

(30) Foreign Application Priority Data

Aug. 29, 2003    (JP)    ............. 2003-307219

(51) Int. Cl.
*H01J 63/04*    (2006.01)
*H01J 1/62*    (2006.01)

(52) U.S. Cl. .............. 313/504; 313/483; 313/497; 313/500; 313/501; 313/502; 313/503; 313/505; 313/506; 257/103; 428/690; 428/917

(58) Field of Classification Search .............. None
See application file for complete search history.

(56) References Cited

U.S. PATENT DOCUMENTS 4,885,211 A    12/1989    Tang et al.

(Continued)

FOREIGN PATENT DOCUMENTS

EP    0 278 757    8/1988

(Continued)

OTHER PUBLICATIONS

"Electrically Induced Optical Emission from a Carbon Nanotube FET" J. A. Misewich, R. Martel, Ph. Avouris, J. C. Tsang, S. Heinze, J. Tersoff, Science, 2003, vol. 300, May 2, 2003, pp. 783-786.

(Continued)

*Primary Examiner*—Nimeshkumar D Patel
*Assistant Examiner*—Natalie K Walford
(74) *Attorney, Agent, or Firm*—Rabin & Berdo, PC

(57) ABSTRACT

An organic semiconductor device includes organic semiconductor layers (3, 4) and an electron injecting electrode (5) which is composed of MgAu alloy and injects electrons into the organic semiconductor layers (3, 4). The MgAu alloy forming the electron injecting electrode (5) may contain not more than 85 atom % of Au. The organic semiconductor device may further include a hole injecting electrode (2) for injecting holes into the organic semiconductor layers (3, 4). The electron injecting electrode and the hole injecting electrode are arranged apart from each other in such a manner that they fit to each other. The organic semiconductor device may further include a gate electrode which is arranged opposite, via an insulating film, to the region between the electron injecting electrode and the hole injecting electrode.

16 Claims, 9 Drawing Sheets

U.S. PATENT DOCUMENTS

| | | | |
|---|---|---|---|
| 5,717,051 A * | 2/1998 | Hiraoka et al. | 428/429 |
| 5,969,474 A | 10/1999 | Arai | |
| 6,392,340 B2 * | 5/2002 | Yoneda et al. | 313/506 |
| 6,520,819 B1 * | 2/2003 | Sakaguchi | 445/24 |
| 6,833,560 B2 * | 12/2004 | Konuma et al. | 257/72 |
| 2002/0024298 A1 | 2/2002 | Fukunaga | |
| 2002/0128515 A1 | 9/2002 | Ishida et al. | |
| 2002/0164835 A1 | 11/2002 | Dimitrakopoulos et al. | |
| 2007/0249076 A1 | 10/2007 | Ishida et al. | |
| 2008/0012475 A1 * | 1/2008 | Oyamada et al. | 313/504 |
| 2008/0105865 A1 * | 5/2008 | Oyamada et al. | 257/40 |
| 2008/0164460 A1 * | 7/2008 | Oyamada et al. | 257/40 |

FOREIGN PATENT DOCUMENTS

| | | |
|---|---|---|
| JP | 2-15595 | 1/1990 |
| JP | 05-315078 | 11/1993 |
| JP | 10-125469 | 5/1998 |
| JP | 2002-117985 | 4/2002 |
| JP | 2002-215065 | 7/2002 |
| JP | 2002-322173 | 11/2002 |
| JP | 2003-167222 | 6/2003 |
| JP | 2004-531772 | 10/2004 |
| JP | 2004-311221 | 11/2004 |
| WO | WO 03/001496 | 1/2003 |

OTHER PUBLICATIONS

Satoshi Hoshino et al.: "Device Performance of an *n*-Channel Organic Thin-Film Transistor with LiF/Al Bilayer Source and Drain Electrodes" Japanese Journal of Applied Physics, Japan Society of Applied Physics, Tokyo, Japan, vol. 41, No. 7A, Part 2, Jul. 1, 2002, XP-001151607, pp. L808-L810.

J. H. Schön et al.: "A Light-Emitting Field-Effect Transistor" Science, American Association for the Advancement of Science, Washington, DC, US, Vol. 290, Nov. 3, 2000, XP-002968870, pp. 963-965.

* cited by examiner

ORGANIC SEMICONDUCTOR DEVICE AND
METHOD FOR MANUFACTURING SAME

BACKGROUND OF THE INVENTION

1. Field of the Invention

The present invention relates to an organic semiconductor device of an arrangement wherein electrons are injected from an electron injecting electrode into organic semiconductor layers, and a method for manufacturing the organic semiconductor device.

2. Description of the Prior Art

An organic electroluminescence element, which is a typical example of an organic semiconductor device, is a light emitting element that makes use of a light emitting phenomenon that accompanies the recombination of electrons and holes in organic semiconductor layers. Specifically, an organic electroluminescence element includes organic semiconductor light emitting layers, an electron injecting electrode that injects electrons into the organic semiconductor light emitting layers, and a hole injecting electrode that injects holes into the organic semiconductor light emitting layers (see Japanese Unexamined Patent Publication No. 5-315078 (1993)).

To improve the light emitting efficiency, the electron injecting electrode must be made from a material of high electron injection efficiency, the hole injecting electrode must be made from a material of high hole injection efficiency, and a material of low work function is thus required for the electron injecting electrode.

Though from the standpoint of the work function, an Mg film is a likely candidate for the material of the electron injecting electrode, an Mg film oxidizes readily and is chemically unstable. Since an Mg film does not have a sufficient adhesive force to a base film and either is impossible to form into a film or peels off readily even if formed into a film, it is low in reliability and not fit for practical use.

Though MgAg alloys and MgIn alloys have thus been used as materials of the electron injecting electrode, with these materials, the electron injection efficiency is inadequate and separation of the electron injecting electrode occurs when continuous light emitting operation is performed over a long period of time (see Japanese Unexamined Patent Publication No. 5-315078). Moreover, an MgAg alloy is inadequate in durability against lithography processes using such organic solvents as acetone and IPA (isopropyl alcohol) and is unsuited for preparing an electron injecting electrode with a microscopic structure such as a comb-like shape.

Though Japanese Unexamined Patent Publication No. 5-315078 discloses the forming of an electron injecting electrode with a two-layer structure of an Mg layer and an Au layer on light emitting layers, a base layer to which the Mg layer can be adhered is limited, and such a structure cannot be realized depending on the type of the base layer. For example, when an electron injecting electrode is to be formed on a silicon oxide film, since an Mg layer will not adhere to the silicon oxide film, the above structure cannot be employed. Moreover, since the Mg layer is not durable against lithography processes using organic solvents, the electron injecting electrode of the above arrangement cannot be employed in a case where an electron injecting electrode with a microscopic structure is to be prepared.

DISCLOSURE OF THE INVENTION

An object of the present invention is to provide an organic semiconductor device, having an electron injecting electrode that is high in electron injection efficiency and is high in reliability, and a method for manufacturing such an organic semiconductor device.

Another object of the present invention is to provide an organic semiconductor device, having an electron injecting electrode that can be microfabricated by a lithography process, and a method for manufacturing such an organic semiconductor device.

An organic semiconductor device according to the present invention comprises: an organic semiconductor layer; and an electron injecting electrode, formed of an MgAu alloy and injecting electrons into the above-mentioned organic semiconductor layer.

Though Au (gold) is used widely as an electrode material of semiconductor devices, it has been considered to be in appropriate as a material of an electron injecting electrode of an organic semiconductor device due to its high work function. Also, there is a stereotype concept that Au generally does not form alloys, and there has thus not been an example of forming an electron injecting electrode from an Au alloy.

According to research by the present inventors, an alloy of Au and Mg (magnesium) can be formed, and the MgAu alloy has been confirmed to be close in work function to the work function of Mg, be high in electron injection efficiency in comparison to MgAg alloys and other generally used electron injecting electrode materials, and exhibit good adhesion properties regardless of the type of a base layer. More specifically, good adhesion properties are exhibited even with respect to silicon oxide films and peeling does not occur even after the elapse of a long period of time.

MgAu alloy has also been confirmed to exhibit a unique chemical stability, is far more chemically stable than MgAg alloys, and is also good in corrosion resistance against organic solvents. For example, since MgAu alloy withstands lithography processes using organic solvents such as acetone and IPA (isopropyl alcohol), it can be used to prepare a microscopic electrode structure, such as that of comb-teeth-like shape. An electron injecting electrode formed of MgAu alloy also exhibits adequate durability even with continuous driving.

Thus by the present invention, an organic semiconductor device, having an electron injecting electrode that is high in electron injection efficiency and is high in reliability, can be realized, and an organic semiconductor device, having an electron injecting electrode that can be microprocessed by a lithography process, can be realized.

MgAu alloy forming the above-mentioned electron injecting electrode preferably contains not more than 85 atom % of Au.

That is, preferably the Au content of the MgAu alloy forming the electron injecting electrode is greater than 0 and not more than 85 atom %. Such an MgAu alloy exhibits a low work function close to the work function of Mg and exhibits chemically stable properties.

The Au content of the MgAu alloy is preferably not less than 0.1 atom % and more preferably not less than 1 atom %. The chemical stability of the electron injecting electrode can thereby be improved and the sheet resistance of the electron injecting electrode can be reduced.

Preferably, the above-mentioned organic semiconductor device also includes a hole injecting electrode that injects holes into the organic semiconductor layer. The hole injecting electrode may be formed of MgAu alloy or may be formed of a material other than MgAu alloy.

Preferably, the electron injecting electrode and the hole injecting electrode respectively have comb-teeth-like portions kept apart from each other in a manner whereby the electrodes virtually fit to each other.

As mentioned above, since microprocessing by a lithography process can be performed on MgAu alloy, the electrodes can be shaped to comb-teeth-like shapes. By making the electron injecting electrode and the hole injecting electrode have mutually-fitting comb-teeth-like portions that are kept apart by an interval (a microscopic interval), the total length of the portions of the electron injecting electrode and the hole injecting electrode that oppose each other can be made long. The recombination of holes and electrons can thus be made to occur effectively. Low-voltage drive is thereby enabled, and in the case where the organic semiconductor layer is an organic semiconductor light-emitting layer, a high light emitting efficiency can be realized. By forming the comb-teeth portions with microscopic widths so that the light emission will be recognized visually as a surface emitting state, a practically surface emitting light source can be realized.

Preferably, the organic semiconductor device furthermore includes a gate electrode that opposes, via an insulating film, a region of the organic semiconductor layer between the electron injecting electrode and the hole injecting electrode.

With this arrangement, an FET (field effect transistor) type organic semiconductor device can be realized, and the recombination of electrons and holes in the organic semiconductor layer can be controlled by a control voltage provided to the gate electrode. Thus when the organic semiconductor layer is made from an organic semiconductor light emitting layer, on/off control of light emission can be performed by providing binary control voltages of a high level and a low level to the gate electrode, or gradation control of the light emission intensity can be performed by providing, to the gate electrode, a stepless control voltage that is controlled in a continuous manner or multiple value control voltages that are controlled in a stepwise manner.

Preferably, the electron injecting electrode and the hole injecting electrode are formed so as to contact the insulating film and be spaced apart at an interval in a direction parallel to the insulating film, and the organic semiconductor layer is formed on the insulating film in a region between the electron injecting electrode and the hole injecting electrode.

With this arrangement, since the electron injecting electrode and the hole injecting electrode are formed on the insulating film, microprocessing of the electron injecting electrode and the hole injecting electrode by a lithography process can be performed prior to forming the organic semiconductor layer. As mentioned above, MgAu alloy film can be formed regardless of a type of the base film and can be formed with a good adhesion property even on a silicon oxide film, which is a typical insulating film. Thus even if the device is of a bottom contact type structure, wherein the electron injecting electrode and the hole injecting electrode are disposed on the insulating film and the organic semiconductor layer is disposed so as to cover these components, the device with high reliability can be realized.

Moreover, with the bottom contact structure, with which the organic semiconductor layer can be formed after forming the electron injecting electrode and the hole injecting electrode, the organic semiconductor layer will not be exposed to the organic solvents used in microprocessing the electron injecting electrode and the hole injecting electrode. The merit that the electron injecting electrode and the hole injecting electrode of microscopic structures can be formed without damaging the organic semiconductor layer is thus provided.

Needless to say, the organic semiconductor device according to the present invention may take on a top contact structure, wherein the electron injecting electrode and the hole injecting electrode are formed on the organic semiconductor layer (for example, formed by lamination on an insulating film). However in this case, it is preferable not to apply a lithography process for patterning the electron injecting electrode and the hole injecting electrode but to apply a process of forming electrodes of desired patterns on the organic semiconductor layer by selective vapor deposition of the materials of the electron injecting electrode and the hole injecting electrode onto the organic semiconductor layer via a predetermined mask.

Also, to minimize thermal effects on the organic semiconductor layer, Mg and Au are preferably vaporized using a boat of low radiant heat (a microscopic boat) to form a vapor deposited film of MgAu alloy on the surface of the organic semiconductor layer.

The organic semiconductor layer may include an organic semiconductor light emitting layer that emits light by recombination of electrons injected by the electron injecting electrode and holes injected from the hole injecting electrode. With this arrangement, the recombination of holes and electrons in an organic semiconductor light emitting layer allows light to emit.

The organic semiconductor device may furthermore include an electron takeout electrode for taking out electrons from the organic semiconductor layer. By this arrangement, a semiconductor device of a form, wherein electrons move from the electron injecting electrode to the electron takeout electrode through the organic semiconductor layer, can be realized.

Preferably, the electron injecting electrode and the electrode takeout electrode respectively have comb-teeth-like portions positioned apart from each other in a manner whereby the electrodes virtually fit mutually as if put in mutual contact.

As mentioned above, since microprocessing by a lithography process can be performed on MgAu alloy, the electrodes can be shaped to comb-teeth-like shapes. Since by making the electron injecting electrode and the electron takeout electrode have mutually-fitting comb-teeth-like portions that are kept apart by an interval (a microscopic interval), the total length of the portions of the electron injecting electrode and the electron takeout electrode that oppose each other can be made long, electrons move efficiently inside the organic semiconductor light-emitting layer. A low voltage drive is thus enabled.

Preferably, the organic semiconductor device furthermore includes a gate electrode that opposes, via an insulating film, a region of the organic semiconductor layer between the electron injecting electrode and the electron takeout electrode.

With this arrangement, an FET (field effect transistor) type organic semiconductor device can be realized, and the movement of electrons in the organic semiconductor layer can be controlled by a control voltage provided to the gate electrode. The organic semiconductor device can thereby be made to perform on/off operations as a switching element or perform an amplifying operation.

Preferably, the electron injecting electrode and the electron takeout electrode are formed so as to contact the insulating film and be spaced apart at an interval in a direction parallel to the insulating film, and the organic semiconductor layer is formed on the insulating film in a region between the electron injecting electrode and the electron takeout electrode.

With this arrangement, since the electron injecting electrode and the electron takeout electrode are formed on the insulating film, microprocessing of the electron injecting electrode and the electron takeout electrode by a lithography process can be performed prior to forming the organic semiconductor layer.

An organic semiconductor device manufacturing method according to the present invention comprises the steps of: forming an electrode film, formed of MgAu alloy, on a substrate; forming electrodes by patterning the electrode film through a lithography process; and forming an organic semiconductor layer so as to cover the electrodes that are formed.

By the present invention, since the lithography process can be performed on the electrode film formed of MgAu alloy, electrodes (at least an electron injecting electrode, and preferably both an electron injecting electrode and a hole injecting electrode) of microscopic structures can be formed. By thereafter forming the organic semiconductor layer, the organic semiconductor layer will not be exposed to organic solvents used in the lithography process and the organic semiconductor layer can be made to possess predetermined characteristics.

Moreover, since the electrodes are formed of MgAu alloy, the electrodes have good durability against the lithography process and do not become peeled from the substrate.

The above and other objects, characteristics, and advantages of the present invention will be made clear by the following description of the embodiments made in reference to the attached drawings.

BEST MODE(S) FOR CARRYING OUT THE INVENTION

Figure 1:
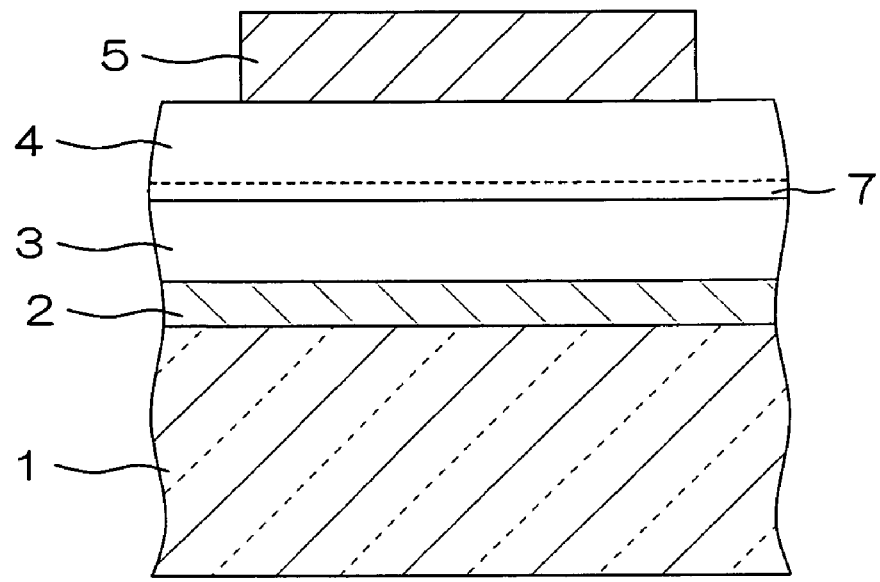
FIG. 1 is a schematic sectional view for describing an arrangement of an organic semiconductor device according to a first embodiment of the present invention.

FIG. 1 is a schematic sectional view for describing an arrangement of an organic semiconductor device according to a first embodiment of the present invention. This organic semiconductor device is a so-called organic electroluminescence element, and is arranged by forming a hole injecting electrode 2, formed of an ITO (a solid solution of indium oxide ($In_2O_3$) and tin oxide ($SnO_2$)) film, on a glass substrate 1; laminating a hole transport layer 3, formed of an α-NPD (Bis[N-(1-naphthyl)-N-phenyl]benzidine) layer, on a hole injecting electrode 2; laminating an electron transport layer 4, formed of an Alq3 (Tris-(8-hydroxyquinoline) aluminum) layer, on the hole transport layer 3; and laminating an electron injecting electrode 5, formed of an MgAu alloy film, on the electron transport layer 4.

The hole transport layer 3 and the electron transport layer 4 makeup an organic semiconductor layer, and in the present embodiment, the electron transport layer 4, formed of the Alq3 layer, makes up an organic semiconductor light emitting layer. For example, the hole injecting electrode 2 has a film thickness of 110 nm, hole transport layer 3 has a film thickness of 50 nm, electron transport layer 4 has a film thickness of 50 nm, and electron injecting electrode 5 has a film thickness of 100 nm.

When a predetermined drive voltage, with which the hole injecting electrode 2 side is positive, is applied across the hole injecting electrode 2 and the electron injecting electrode 5, holes are injected into the hole transport layer 3 from the hole injecting electrode 2 and electrons are injected into the electron transport layer 4 from the electron injecting electrode 5. These holes and electrons are transported to the interface between hole transport layer 3 and electron transport layer 4 and recombine and emit light in a light emitting region 7 inside the electron transport layer 4 near the interface.

Figure 2:
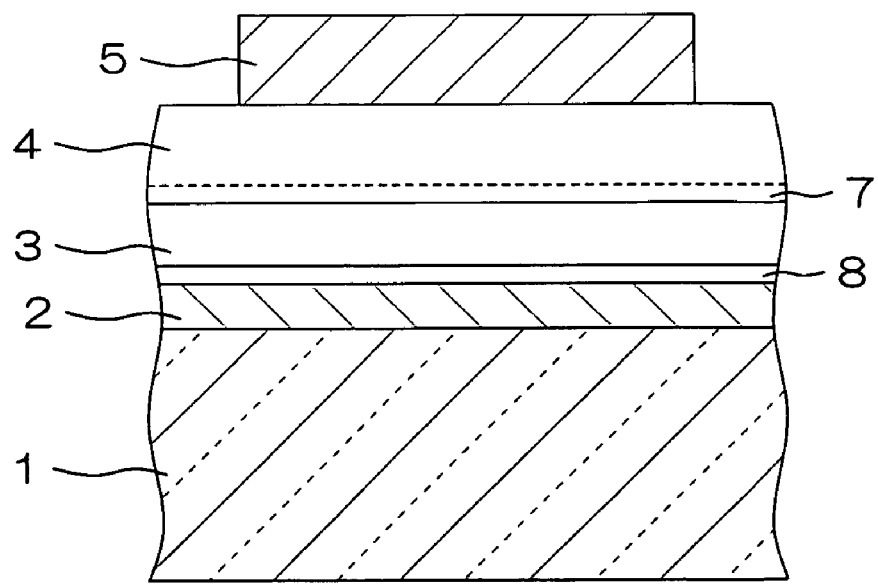
FIG. 2 is a schematic sectional view for describing an arrangement of an organic semiconductor device according to a modification of the arrangement shown in FIG. 1.

FIG. 2 is a schematic sectional view for describing an arrangement of an organic semiconductor device according to a modification of the arrangement shown in FIG. 1. In FIG. 2, respective components corresponding to components of FIG. 1 are provided with the same reference numerals as those of FIG. 1.

With the arrangement of FIG. 2, a hole injection layer 8, formed of CuPc (copper phthalocyanine), is interposed between the hole injecting electrode 2 and the hole transport layer 3. By the function of the hole injection layer 8, the injection efficiency of holes is increased and the light emitting efficiency is improved. For example, the hole injection layer 8 is made 10 nm in film thickness, the hole transport layer 3 is made 40 nm in film thickness, and the other respective layers are made to be the same in film thickness as in the arrangement of FIG. 1.

Figure 3:
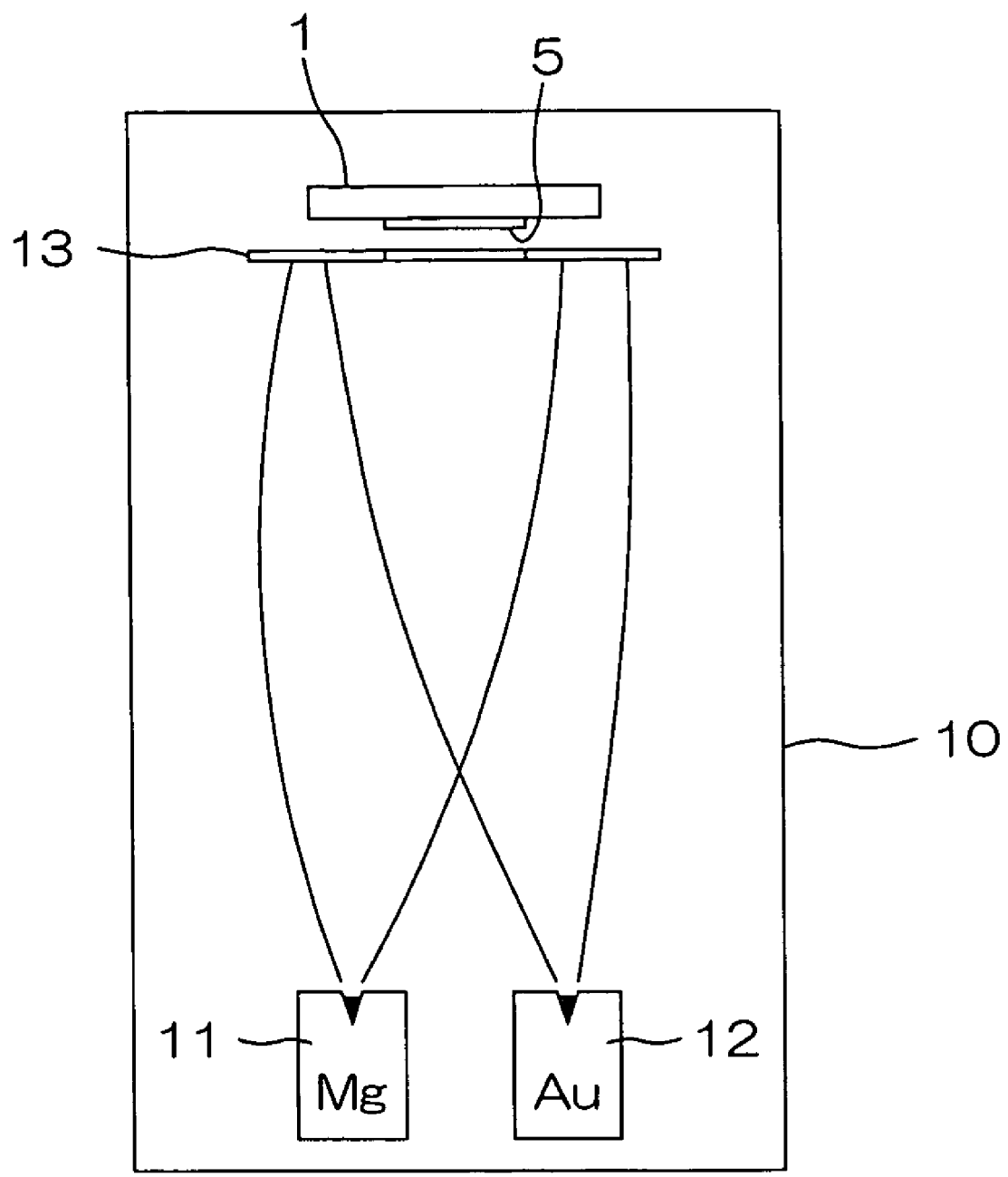
FIG. 3 is a schematic view for describing a method for forming an electron injecting electrode.

FIG. 3 is a schematic view for describing a method for forming the electron injecting electrode 5. The glass substrate 1, on which the hole injecting electrode 2, the hole transport layer 3, and the electron transport layer 4 (and the hole injection layer 8 in the case of the arrangement of FIG. 2) have been formed, is held facing downward inside a vacuum chamber 10. Inside the vacuum chamber 10 are positioned a boat (crucible) 11 for vaporizing Mg and a boat 12 for vaporizing Au. These boats 11 and 12 are, for example, resistance heating types and enable control of the vaporization rate. Both those boats 11 and 12 are microscopic and are arranged so that effects on the organic semiconductor layers (hole transport layer 3 and electron transport layer 4, and further more hole injection layer 8 in the case of the arrangement of FIG. 8) due to radiant heat from the boats are minimized. The substrate temperature is set, for example, to room temperature. It is considered that effects of oxygen, etc., can be better lessened to restrain degradation when the degree of vacuum inside vacuum chamber 10 increases, and in general, the degree of vacuum inside vacuum chamber 10 is preferably set to not more than $1 \times 10^{-3}$ Pa.

With such an arrangement, by vaporizing Mg and Au from the boats 11 and 12 and guiding these atoms to the surface of the electron transport layer 4 on the glass substrate 1, electron injecting electrode 5, formed of the MgAu alloy film, can be formed on the electron transport layer 4. By positioning a mask 13, having an opening with dimensions and a shape corresponding to the electron injecting electrode 5, near the substrate 1 and at the side of the boats 11 and 12, the electron injecting electrode 5 of the desire shape can be formed on the electron transport layer 4. Also by adjusting the rates of vaporization from the boats 11 and 12, the atomic ratio of MgAu alloy that makes up the electron injecting electrode 5 can be controlled.

Figure 4A:
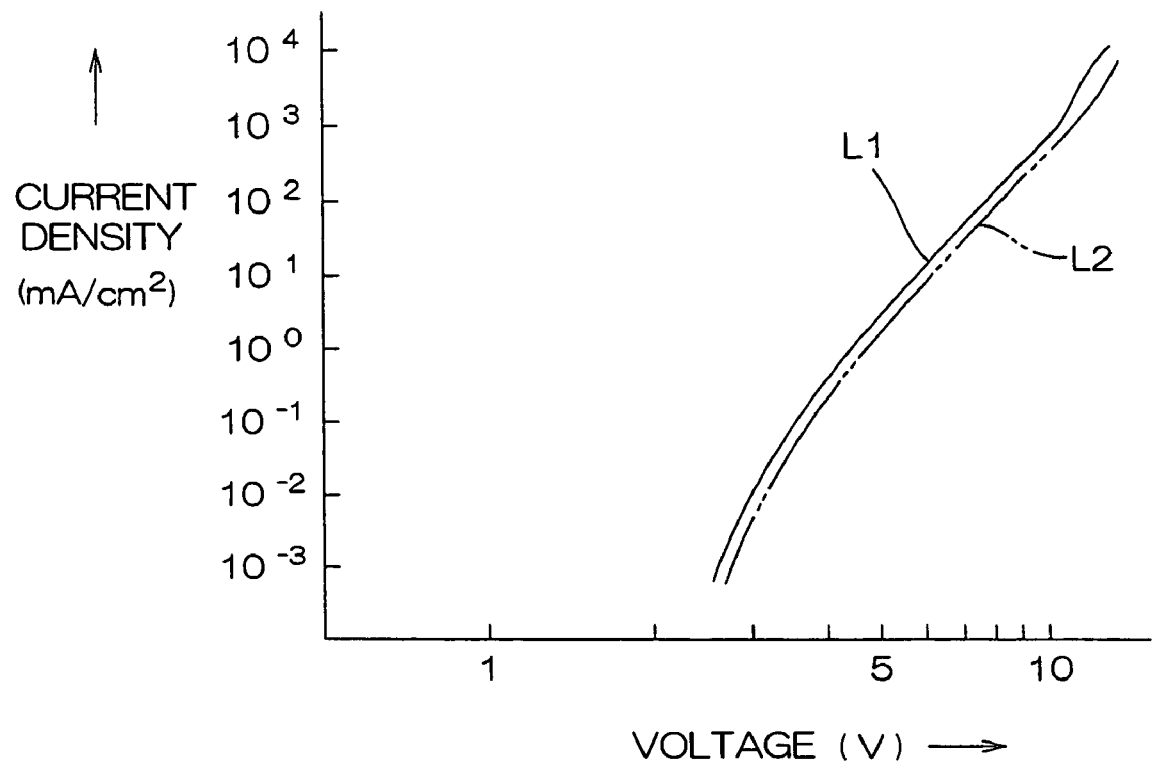
FIGS. 4(a) and 4(b) are diagrams of characteristics of the organic semiconductor device with the structure of FIG. 1.

FIG. 4(a) is a diagram of operation characteristics of the organic semiconductor device with the structure of FIG. 1 and shows relationships between the drive voltage applied across the hole injecting electrode 2 and the electron injecting electrode 5 and the results of measuring the current density at each drive voltage. A curve L1 shows the operation characteristics of the device with the structure of FIG. 1, and a curve L2 shows the operation characteristics for the case where MgAg alloy is used for the electron injecting electrode 5.

A comparison of the curves L1 and L2 shows that by forming the electron injecting electrode from MgAu alloy, even at the same drive voltage the current density is made higher than in the case where the electron injecting electrode is formed of MgAg alloy. It can thus be understood that by forming the electron injecting electrode from MgAu alloy, the electron injection efficiency is improved and consequently, low voltage drive is realized.

Figure 4B:
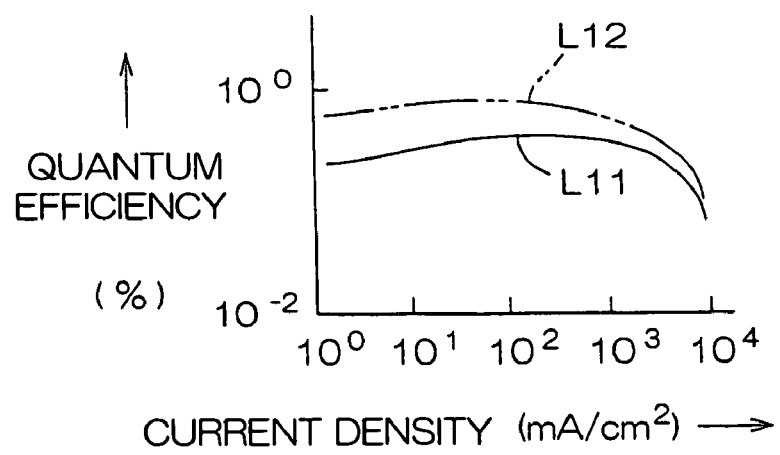

FIG. 4(b) is a diagram showing the relationships of quantum efficiency (light emitting efficiency) with respect to the current density in the organic semiconductor device with the structure of FIG. 1. A curve L11 shows the results of measuring the quantum efficiency of the device of the structure of FIG. 1, and a curve L12 shows the results of measuring the quantum efficiency for the case where MgAg alloy is used for electron injecting electrode 5. Though a comparison of the curves L11 and L12 shows that the quantum efficiency is lower when the electron injecting electrode is formed of MgAu alloy than when MgAg alloy makes up the electron injecting alloy, this is presumed to be caused by a breakdown of balance between the hole injection efficiency and the electron injection efficiency due to the use of MgAu alloy of good electron injection efficiency. The diffusion of Au atoms into the organic semiconductor layer due to radiant heat from the Au vapor deposition source can be cited as another cause.

Figure 5A:
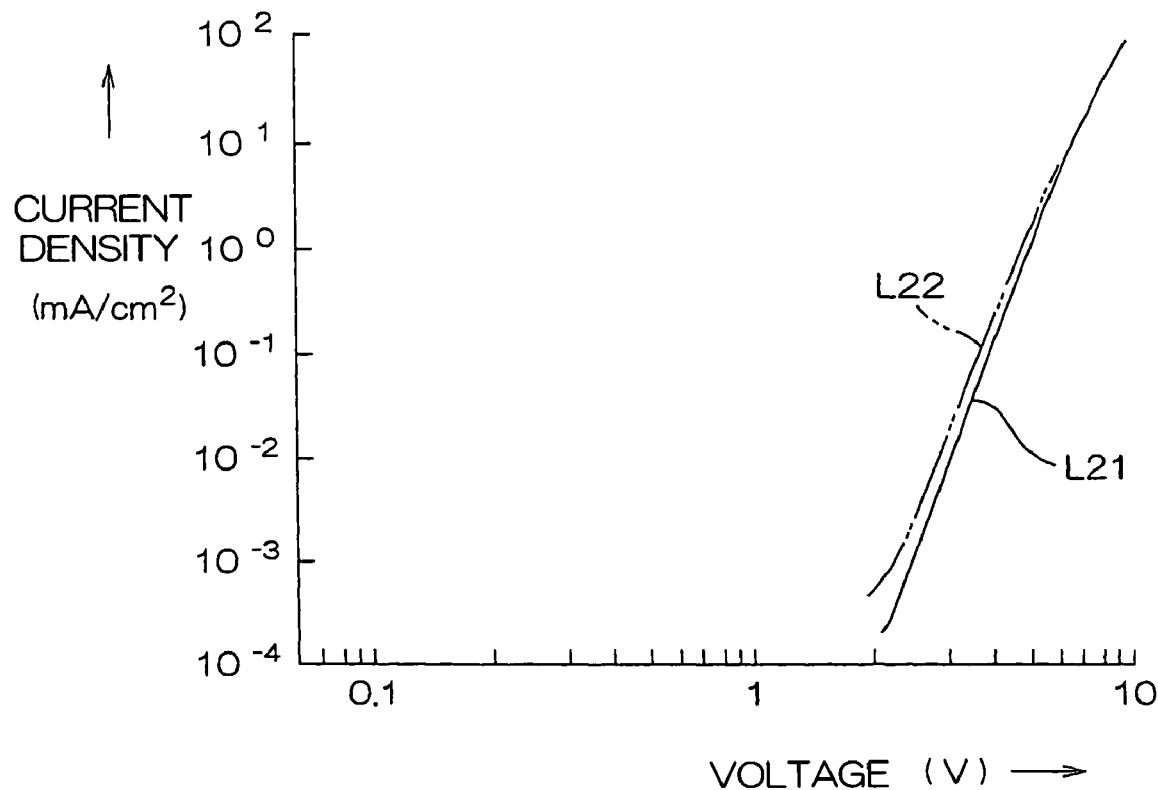
FIGS. 5(a) and 5(b) are diagrams of operation characteristics of the organic semiconductor device with the structure of FIG. 2.

FIG. 5(a) is a diagram of operation characteristics of the organic semiconductor device with the structure of FIG. 2 and shows relationships between the drive voltage applied across the hole injecting electrode 2 and the electron injecting electrode 5 and the results of measuring the current density at each drive voltage. A curve L21 shows the operation characteristics of the device of the structure of FIG. 2, and a curve L22 shows the operation characteristics for the case where MgAg alloy is used for the electron injecting electrode 5.

A comparison of the curves L21 and L22 shows that by forming the electron injecting electrode from MgAu alloy, the same operation characteristics as those in the case where the electron injecting electrode is formed of MgAg alloy can be realized.

Figure 5B:
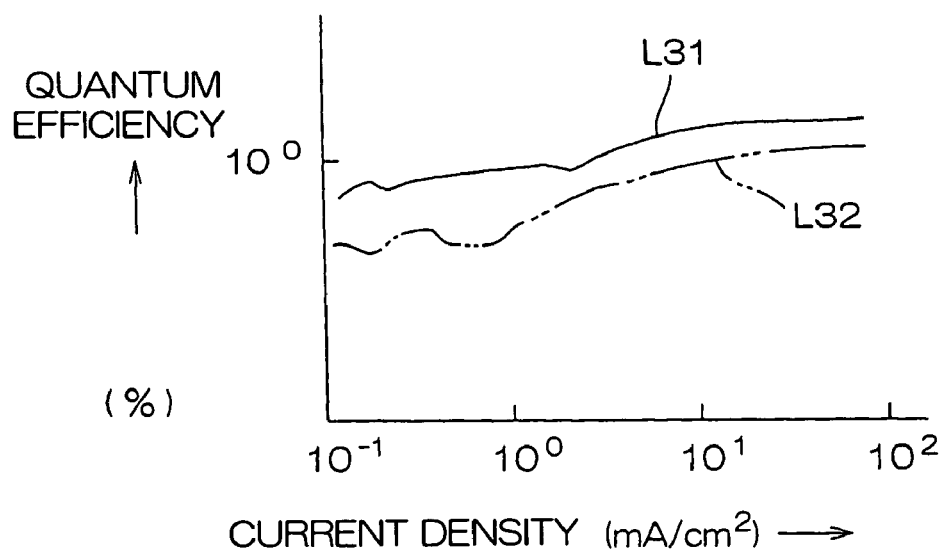

FIG. 5(b) is a diagram showing the relationships of quantum efficiency (light emitting efficiency) with respect to the current density in the organic semiconductor device with the structure of FIG. 2. A curve L31 shows the results of measuring the quantum efficiency of the device of the structure of FIG. 2, and a curve L32 shows the results of measuring the quantum efficiency for the case where MgAg alloy is used for electron injecting electrode 5. A comparison of the curves L31 and L32 shows that the quantum efficiency is higher when the electron injecting electrode is formed of MgAu alloy than when MgAg alloy makes up the electron injecting alloy. This is presumed to be due to the harmonization of the efficiency of injection of electrons from the electron injecting electrode formed of MgAu alloy and the hole injection efficiency due to the introduction of the hole injection layer 8.

The comparisons of FIGS. 4(a) and 4(b) and FIGS. 5(a) and 5(b) show that the arrangement of the organic semiconductor layer can be selected according to the desired device characteristics (low-voltage drive, high light emitting efficiency, etc.) and that the excellent characteristics of the organic semiconductor device, in which the electron injecting electrode is formed from MgAu alloy, can thereby be brought out.

Figure 6:
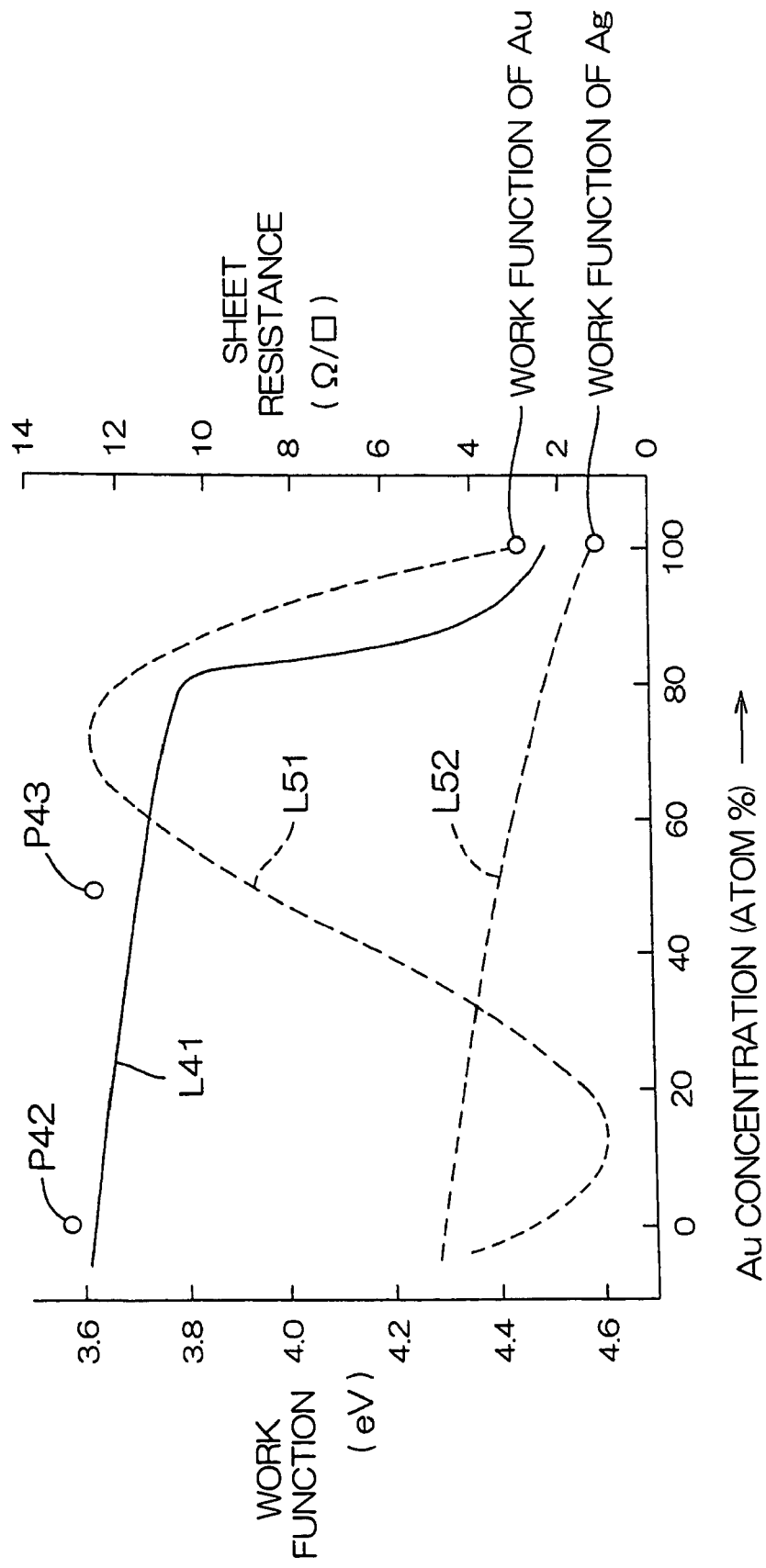
FIG. 6 is a diagram of results of measuring relationships between Au atom content and work function and between Au atom content and sheet resistance with respect to an MgAu alloy thin film.

FIG. 6 is a diagram of results of measuring relationships between Au atom content and work function and between Au atom content and sheet resistance of an MgAu alloy thin film with a thickness of 40 nm. A curve L41 indicates measured values of the work function and a curve L51 indicates measured values of the sheet resistance. Points P42 and P43 indicate measured values of the work function of an MgAg alloy thin film, and a curve L52 indicates measured values of the sheet resistance of the MgAg alloy thin film.

The curve L41 shows that when the Au atom content is not more than 85 atom %, the work function becomes 4.0 eV or less and becomes closer in value to the work function of Mg alone than the work function of Au alone and thus good electron injection efficiency can be anticipated. The curve L51 shows that when the Au atom content is in the range of 5 to 25 atom %, the sheet resistance becomes substantially equal in value to that of Au alone and a low-resistance electrode film can be realized.

Figure 7:
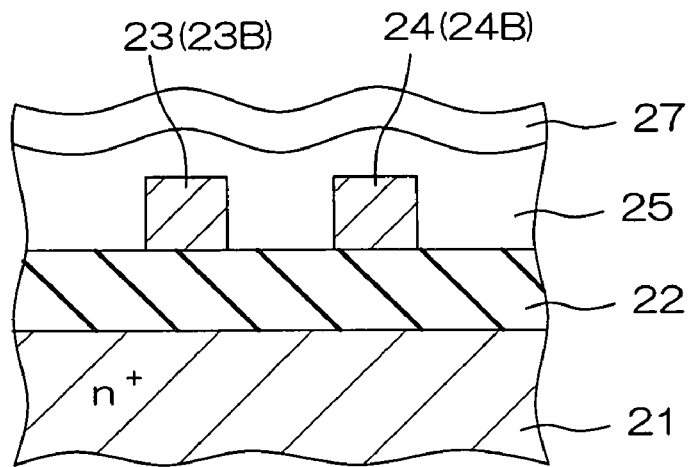
FIG. 7 is a schematic sectional view for describing an arrangement of an organic semiconductor device according to a second embodiment and a third embodiment of the present invention.

FIG. 7 is a schematic sectional view for describing an arrangement of an organic semiconductor device according to a second embodiment of the present invention. This organic semiconductor device is an element having the basic structure of an FET (field effect transistor) (unipolar type organic semiconductor FET) and is arranged by forming a silicon oxide film 22 as an insulating film on a gate electrode 21 that is formed of an $n^+$ silicon substrate into which an impurity has been introduced at a high concentration, forming a source electrode 23 as an electron injecting electrode and a drain electrode 24 as an electron takeout electrode in a manner such that the electrodes are spaced apart by an interval on the silicon oxide film 22, and forming an organic semiconductor layer 25 so as to cover and be interposed between the source electrode 23 and the drain electrode 24. This structure is called a bottom contact structure since the source electrode 23 and the drain electrode 24 are positioned at the substrate (gate electrode 21) side with respect to the organic semiconductor layer 25.

The source electrode 23 and the drain electrode 24 are both formed of an MgAu alloy thin film (with a film thickness, for example, of 40 nm) and are formed along the surface of the silicon oxide film 22 (that is, along the gate electrode 21 as the substrate) so as to oppose each other while being separated by a microscopic interval (for example, of 25 μm). The organic semiconductor layer 25 is present in a region between the source electrode 23 and the drain electrode 24, and the gate electrode 21 opposes the organic semiconductor layer 25 of this region with the silicon oxide film 22 interposed in between.

With this arrangement, when a voltage, with which the drain electrode 24 side is positive, is applied across the source electrode 23 and the drain electrode 24, electrons are injected from the source electrode 23 into the organic semiconductor layer 25 and the electrons inside the organic semiconductor layer 25 are taken out from the drain electrode 24. The amount of the electrons that flow across the source electrode 23 and the drain electrode 24 through the organic semiconductor layer 25 in this process depends on the voltage applied to the gate electrode 21. By applying a voltage that varies in a stepwise or continuous manner to the gate electrode 21, the state of conduction (on/off or current amount) between the source and drain can be controlled.

More specifically, by applying, to the gate electrode 21, binary control voltages of an off voltage, set so that a channel that realizes conduction between the source and the drain is not formed inside the organic semiconductor layer 25, and a nonvoltage, set so that the channel is formed inside the organic semiconductor layer 25, the organic semiconductor device can be made to operate as a switching element that performs an on/off operation. Also by applying, to the gate electrode 21, a control voltage that varies in a stepless manner or multiple value control voltages that vary in multiple steps of three steps or more, the current that flows between the source and drain can be varied in multiple steps and a current control operation (amplifying operation) can thereby be performed.

Figure 8:
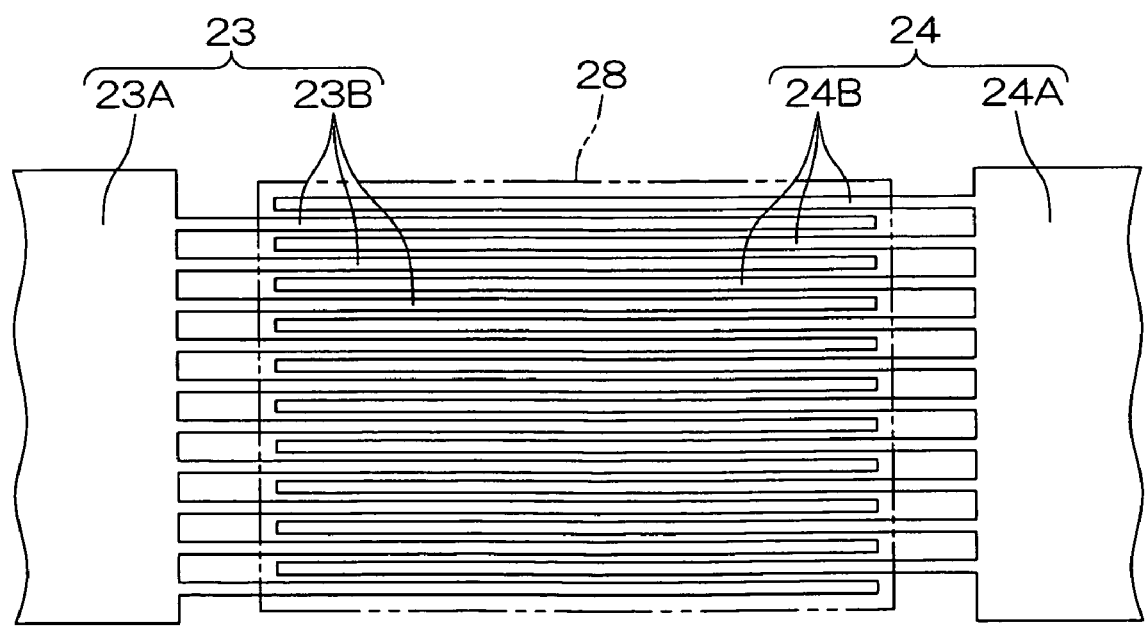
FIG. 8 is a plan view of shapes of a source electrode and drain electrode.

As shown in the plan view of FIG. 8, the source electrode 23 and the drain electrode 24 respectively have main body portions 23A and 24A and a plurality (ten each in the example of FIG. 8) of comb-teeth portions 23B and 24B that protrude in parallel to each other from the main body portions 23A and 24B. The electrodes are positioned on the silicon oxide film 22 so that the comb-teeth portions 23B and 24B fit mutually with a microscopic interval in between. Since the each comb-teeth portion 23B of the source electrode 23 opposes the comb-teeth portion 24B of the drain electrode 24 at both of its sides, the total length of the portions of the source electrode 23 and the drain electrode 24 that practically oppose each other is made long. The respective efficiencies of the injection of electrons into the organic semiconductor layer 25 and the takeout of electrons from the organic semiconductor layer 25 are thereby made high and driving at a low voltage is enabled.

FIGS. 9(a) to 9(f) are schematic sectional views showing, in the order of steps, a method for manufacturing the organic semiconductor device of FIG. 7. First, the silicon oxide film 22 is formed on the gate electrode 21 (silicon substrate) (FIG. 9(a)). A resist film 31 is then formed, for example, by spin coating, on the surface of the gate electrode 21 serving as the substrate on which the silicon oxide film 22 was formed (see FIG. 9(b)).

Figure 9A:
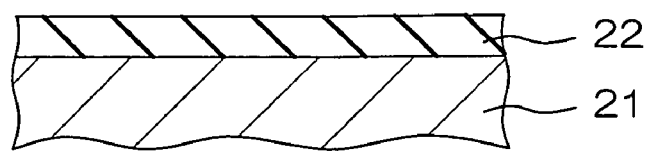
FIGS. 9(a) to 9(f) are schematic sectional views showing, in the order of steps, a method for manufacturing the organic semiconductor device of FIG. 7.
Figure 9B:
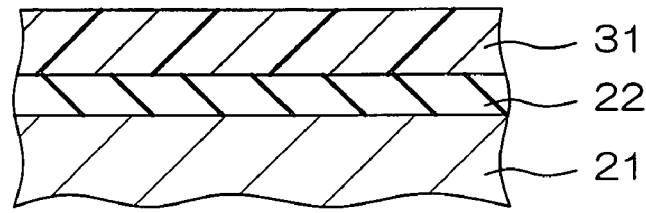
Figure 9C:
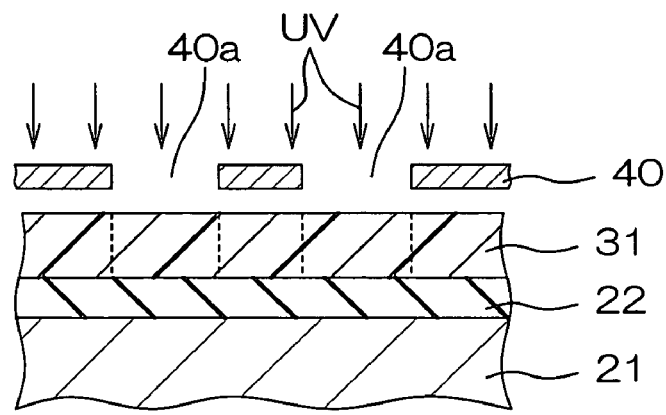
Figure 9D:
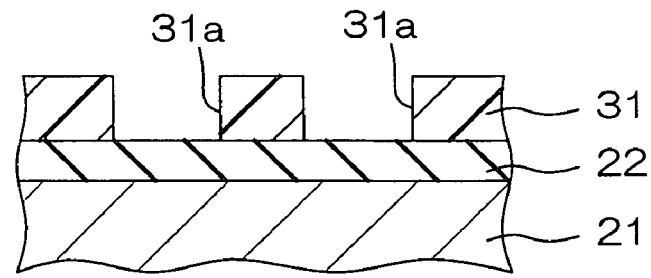

A mask 40, having openings 40a at regions corresponding to the source electrode 23 and the drain electrode 24, is then positioned above the resist film 31 (see FIG. 9(c)). Ultraviolet rays (UV) are then irradiate via the mask 40 and the resist film 31 is thereby exposed.

The resist film 31 is then developed by a developing solution. The exposed regions of the resist film 31 are modified and dissolve in the developing solution. On the other hand, the unexposed regions do not dissolve in the developing solution due to the properties being maintained. The exposed regions of the resist film 31 are thus dissolved and the openings 31a are formed (see FIG. 9(d)).

Figure 9E:
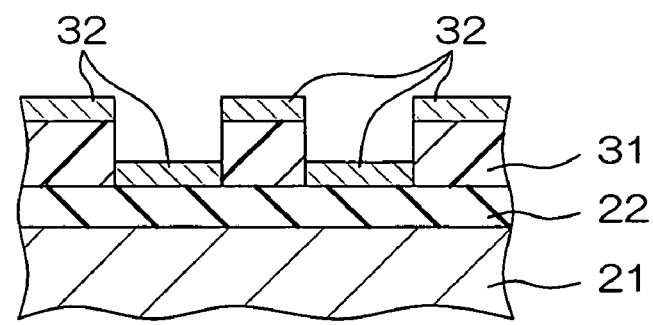

Next, by vapor deposition using the device of the arrangement shown in FIG. 3, Mg atoms and Au atoms are supplied to the resist film 31 and exposed portions of the silicon oxide film 22 in openings 31a, and MgAu alloy thin films 32 are thereby formed over the entire surface (see FIG. 9(e)).

Figure 9F:
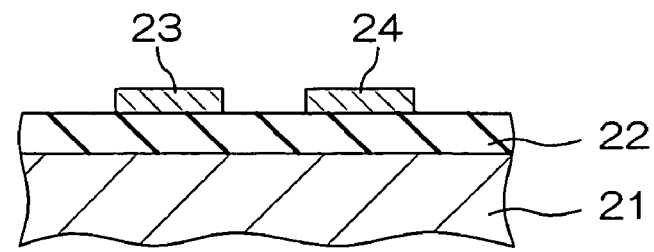

By thereafter removing the resist film 31, the MgAu alloy thin film 32 outside openings 31a is lifted off, and the MgAu alloy thin films 32 at portions corresponding to the openings 31a remain as the source electrode 23 and the drain electrode 24 on the silicon oxide film 22 (see FIG. 9(f)). Thereafter, by forming the organic semiconductor layer 25 so as to cover the entireties of the exposed surfaces of the source electrode 23, the drain electrode 24, and the silicon oxide film 22, the organic semiconductor device of the arrangement shown in FIG. 7 is obtained.

In the lift-off step following a process performed using the Microposit Remover 1165, made by, for example, Shipley Co., the substrate is immersed in an acetone solution and subjected to ultrasonic vibration in the immersed state. Thereafter, the substrate is immersed in IPA and subjected to ultrasonic vibration, and then an IPA boiling process is performed.

Even in such a lift-off process using organic solvents, the MgAu alloy film does not undergo undesirable corrosion, and the source electrode 23 and the drain electrode 24 that are adhered well on the substrate (gate electrode 21) can be obtained.

When forming the source electrode 23 and the drain electrode 24 of an MgAu alloy thin film with an atom ratio of 1:1 on the silicon oxide film 22 and observing with an electron microscope, the present inventors observed the source electrode 23 and the drain electrode 24 adhered to the silicon oxide film 22 in a satisfactory pattern. A change of this state was not observed even when applying a treatment using the organic solvents (acetone and IPA) after a period of one week.

Figure 10:
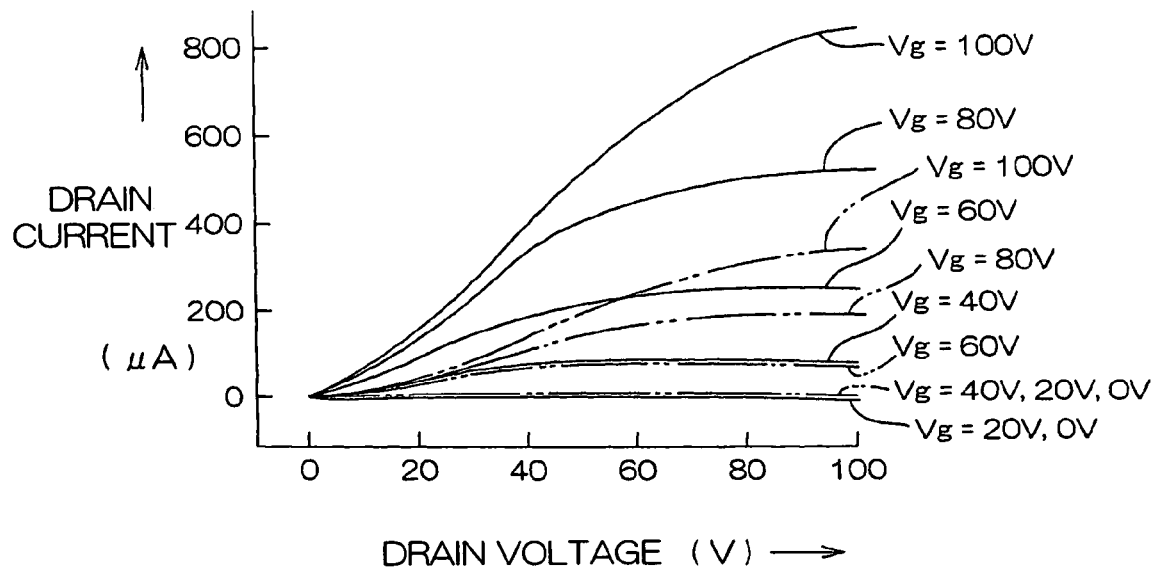
FIG. 10 is a diagram of results of measuring operation characteristics (FET characteristics) of the organic semiconductor device of FIG. 7.

FIG. 10 is a diagram of results of measuring operation characteristics (FET characteristics) of the organic semiconductor device of FIG. 7. The variation of a drain current with respect to a voltage (drain voltage) across the source electrode 23 and the drain electrode 24, made from the MgAu alloy thin films (with an Mg to Au atom ratio of 1:1 and film thickness of 40 nm), is shown in FIG. 10, and the respective measurement results when the gate voltage Vg was set to 0V, 20V, 40V, 60V, 80V and 100V are indicated by solid lines. As a comparative example, results of the same measurements performed on an arrangement with the source electrode 23 and the drain electrode 24 being formed from the MgAg alloy thin films are indicated by an alternate long and two short dashes line. $C_6$-PTC (see chemical formula [F1] below) was used as the organic semiconductor layer 25, and the measurements were made in vacuum ($3.2 \times 10^{-1}$ Pa).

When MgAg alloy is used, the characteristics become poor due to the effects of oxidation at the interface and it can be said that this is apparent in FIG. 10.

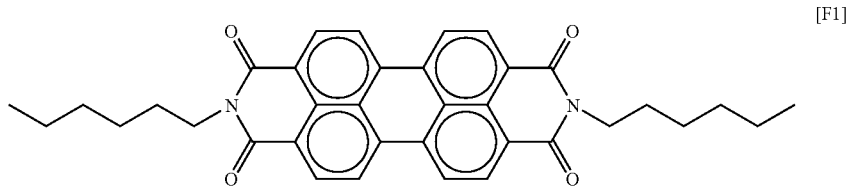

[F1]

Figure 11:
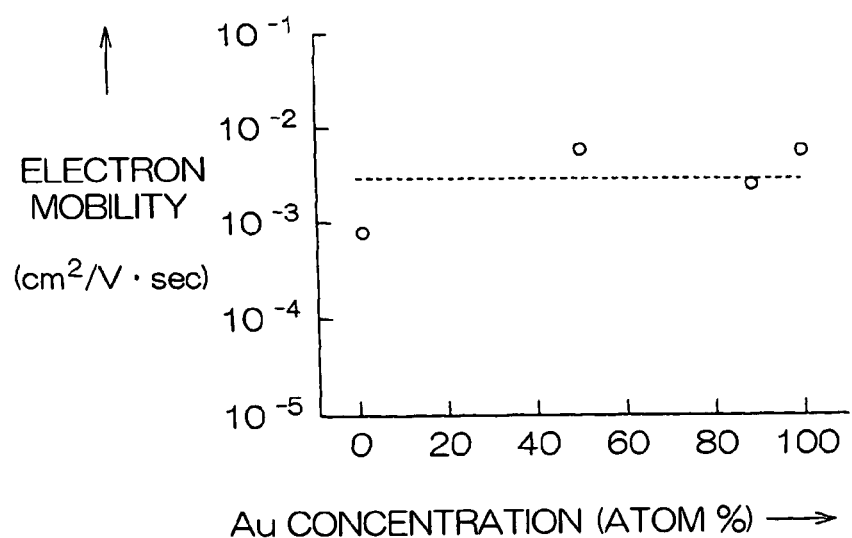
FIG. 11 is a diagram of results of measuring the electron mobility in the organic semiconductor device of FIG. 7.

FIG. 11 shows results of measuring the electron mobility in the organic semiconductor device of FIG. 7 and a variation of the electron mobility with respect to the Au atom concentration of the MgAu thin film that makes up the source electrode 23 and the drain electrode 24. Here, the film thickness of the MgAu thin film was 40 nm and $C_6$-PTC was used as the organic semiconductor layer 25.

From FIG. 11, it can be understood that as long as Au atoms are contained even if slightly, good electron mobility can be secured.

$C_8$-PTC, $C_{12}$-PTC, $C_{13}$-PTC, Bu-PTC, $F_7$Bu-PTC*, Ph-PTC, $F_5$Ph-PTC*, PTCDI, TCNQ, $C_{60}$ fullerene, etc., may be used besides $C_6$-PTC as the organic semiconductor material making up the organic semiconductor layer 25. All of these are organic semiconductor materials that exhibit characteristics as N-type semiconductors and can give rise to movement of electrons in their interiors.

A third embodiment according to the present invention shall now be described with reference to FIGS. 7, 8, etc., with description being omitted for components that are the same as those of the above-described second embodiment.

Though with the above-described second embodiment, movement of electrons is made to occur inside the organic semiconductor layer 25, with the present embodiment, electrons are injected into the organic semiconductor layer 25 from the source electrode 23 formed of MgAu alloy, and holes are injected into the organic semiconductor layer 25 from the drain electrode 24 likewise formed of MgAu alloy. A bipolar type organic semiconductor FET is thus arranged, and an organic electroluminescence element, with which light emission due to the recombination of holes and electrons can be made occur inside the organic semiconductor 25, is arranged.

That is, whereas with the above-described second embodiment, the drain electrode 24 functions as an electron takeout electrode, in the present embodiment, the drain electrode 24 functions as a hole injecting electrode.

As the organic semiconductor material making up the organic semiconductor layer 25, α-NPD, Alq3, BSA-1m (9,10-Bis(3-cyanostilil)anthracene), MEHPPV(Poly[2-methoxy-5-(2-ethylhexyloxy)-1,4-phenylenevinylene]), CN-PPP(Poly[2-(6-cynao-6-methylheptyloxy)-1,4-phenylene]), Bis(2-(2-hydroxyphenyl)-benz-1,3-thiazolato)zinc complex, Poly[(9,9-dihexylfluoren-2,7-diyl)-co-(anthracen-9,10-diyl)] and other bipolar organic semiconductor materials can be used, and the organic semiconductor layer 25 can thus be made to function as an organic semiconductor light emitting layer.

With this arrangement, when a voltage, with which the drain electrode 24 side becomes positive, is applied across the source electrode 23 and the drain electrode 24, electrons are injected into the organic semiconductor layer 25 from the source electrode 23 and holes are injected into the organic semiconductor layer 25 from the drain electrode 24. The amount of electrons and holes injected into the organic semiconductor layer 25 depends on the voltage applied to the gate electrode 21. Thus by applying a voltage that varies in a stepwise or continuous manner to the gate electrode 21, the recombination of electrons and holes in the organic semiconductor layer can be controlled and consequently, the light emission state can be controlled.

More specifically, by providing, to the gate electrode 21, binary control voltages of an off voltage, set so that the recombination of electrons and holes does not occur inside the organic semiconductor layer 25, and an on voltage, set so that there combination of electrons and holes occurs inside the organic semiconductor layer 25, the organic semiconductor device can be controlled between a lit state and an unlit state. By applying, to the gate electrode 21, a control voltage that varies in a stepless manner or multiple value control voltages that vary in multiple steps of three steps or more, the light emission intensity can be varied in a stepless or multiple step manner and a multiple gradation display can thus be performed.

Since each of the comb-teeth portions 23B and 24B are formed to a microscopic width (for example, 50 nm) and the gate electrode 21 opposes the entirety of a rectangular region 28 in which comb-teeth portions 23B and 24B overlap, this rectangular region 28 is visually recognized as a surface emitting light source during light emission.

Since each comb-teeth portion 23B of the source electrode 23 opposes a comb-teeth portion 24B of the drain electrode 24 at both of its sides, the total length of the portions of the source electrode 23 and the drain electrode 24 that practically oppose each other is made long. The respective injection efficiencies of electrons and holes into the organic semiconductor layer 25 are thus made high and light emitting operation at a high efficiency is enabled.

A method for manufacturing the device according to this embodiment is the same as that in the case of the second embodiment described above.

Though three embodiments according to the present invention have been described, the present invention can be put into practice in yet other modes. For example, a buffer layer for reducing an energy barrier may be interposed between the electron injecting electrode and the organic semiconductor layer or between the hole injecting electrode (or electron takeout electrode) and the organic semiconductor layer. For example, when MEHPPV is used as the organic semiconductor layer, a buffer layer formed of PEDOT (poly(ethylenedioxy)thiophene) may be provided. The buffer layer formed of PEDOT acts to reduce the energy barrier between the light emitting layer formed of MEHPPV and the hole injecting electrode (or electron takeout electrode) formed, for example, of ITO, and to reduce the energy barrier between the light emitting layer formed of MEHPPV and the electron injecting electrode formed of MgAu alloy.

With the above-described third embodiment, by laminating a wavelength conversion layer 27 on the organic semiconductor layer 25 as shown in FIG. 7, the light emitted in the organic semiconductor layer 25 can be taken out upon being converted in wavelength at the wavelength conversion layer 27 and light of a desired color can thus be emitted.

Also, though with the embodiment shown in FIG. 7, the silicon substrate itself makes up the gate electrode 21, a gate electrode may be formed apart from the substrate. That is, a thin film gate electrode may be formed on a substrate of any of various types, such as a silicon substrate, a substrate having a silicon oxide layer formed on a silicon substrate, a silicon nitride substrate, a glass substrate, or a sapphire substrate. Such a gate electrode can be formed from a polysilicon film, nickel thin film, aluminum thin film, etc., that have been lowered in resistance by the addition of impurity at a high concentration.

Figure 12:
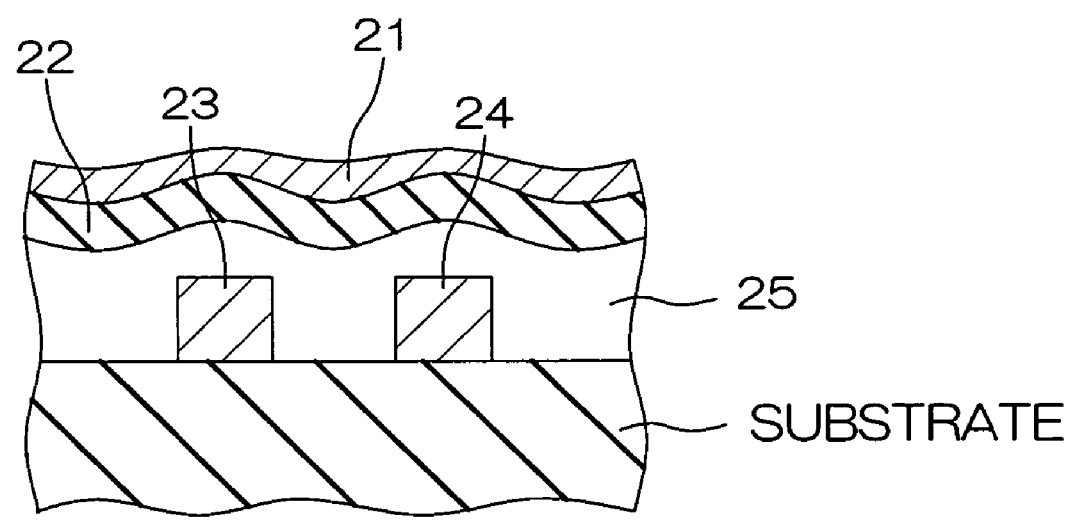
FIG. 12 is a schematic sectional view of another configuration of a gate electrode.

Furthermore, the gate electrode may be formed not on the substrate side but on the organic semiconductor layer as shown in FIG. 12. In FIG. 12, portions corresponding to the respective portions shown in FIG. 7 are provided with the same reference numerals as those of FIG. 7.

Besides silicon oxide, the insulating film interposed between the gate electrode and the organic semiconductor layer maybe formed of tantalumpentoxide, aluminum oxide, a polymer (such as novolac resin, polyimide, etc.).

Though embodiments according to the present invention have been described in detail above, these are merely specific examples used to clarify the technical details of the present invention. The present invention should thus not be interpreted as being restricted to these specific examples and the spirit and the scope of the present invention are restricted only by the appended claims.

The present Application corresponds to Japanese Patent Application No. 2003-307219 submitted to the Japan Patent Office on Aug. 29, 2003, the entire disclosure of which is incorporated herein by reference.

What is claimed is:

1. An organic semiconductor device, comprising:
an organic semiconductor layer; and
an electron injecting electrode, formed of an MgAu alloy that contains not more than 85 atom % of Au, for injecting electrons into the organic semiconductor layer.

2. The organic semiconductor device according to claim 1, further comprising a hole injecting electrode that injects holes into the organic semiconductor layer.

3. The organic semiconductor device according to claim 2, wherein the electron injecting electrode and the hole injecting electrode respectively have comb-teeth-like shapes positioned apart from each other in a manner where the electrodes fit to each other.

4. The organic semiconductor device according to claim 2, further comprising a gate electrode that opposes, via an insulating film, a region of the organic semiconductor layer between the electron injecting electrode and the hole injecting electrode.

5. The organic semiconductor device according to claim 4, wherein the electron injecting electrode and the hole injecting electrode are formed so as to contact the insulating film and be spaced apart in a direction parallel to the insulating film, and
the organic semiconductor layer is formed on the insulating film in a region between the electron injecting electrode and the hole injecting electrode.

6. The organic semiconductor device according to claim 2, wherein the organic semiconductor layer includes an organic semiconductor light emitting layer that emits light by recombination of electrons injected from the electron injecting electrode and holes injected from the hole injecting electrode.

7. The organic semiconductor device according to claim 1, further comprising an electron takeout electrode for taking out electrons from the organic semiconductor layer.

8. The organic semiconductor device according to claim 7, wherein the electron injecting electrode and the electrode takeout electrode have comb-teeth-like portions positioned apart from each other in a manner where the electrodes fit to each other.

9. The organic semiconductor device according to claim 7, further comprising a gate electrode that opposes, via an insulating film, a region of the organic semiconductor layer between the electron injecting electrode and the electron takeout electrode.

10. The organic semiconductor device according to claim 9, wherein the electron injecting electrode and the electron takeout electrode are formed so as to contact the insulating film and be spaced apart in a direction parallel to the insulating film, and
the organic semiconductor layer is formed on the insulating film in a region between the electron injecting electrode and the electron takeout electrode.

11. An organic semiconductor device manufacturing method, comprising the steps of:
forming an electrode film, formed of MgAu alloy that contains not more than 85 atom % of Au, on a substrate;
forming electrodes by patterning the electrode film through a lithography process; and
forming an organic semiconductor layer so as to cover the formed electrodes.

12. The organic semiconductor device according to claim 1, wherein the MgAu alloy forming the electron injecting electrode contains 5-25 atom % of Au.

13. The organic semiconductor device according to claim 4, wherein:
the gate electrode faces both of the electron injecting electrode and thee hole injecting electrode via the insulating film; and
the insulating film is sandwiched between said region of the organic semiconductor layer and the gate electrode, and directly contacts both of said region and the gate electrode.

14. The organic semiconductor device according to claim 9, wherein:
the gate electrode faces both of the electron injecting electrode and the electron takeout electrode; and
the insulating film is sandwiched between said region of the organic semiconductor layer and the gate electrode, and directly contacts both of said region and the gate electrode.

15. The organic semiconductor device according to claim 4, wherein the gate electrode controls movement of the electrons in the organic semiconductor layer between the electron injecting electrode and the hole injecting electrode.

16. The organic semiconductor device according to claim 9, wherein the gate electrode controls movement of the electrons in the organic semiconductor layer between the electron injecting electrode and the electron takeout electrode.

* * * * *

UNITED STATES PATENT AND TRADEMARK OFFICE
CERTIFICATE OF CORRECTION

PATENT NO. : 7,598,668 B2  
APPLICATION NO. : 10/569807  
DATED : October 6, 2009  
INVENTOR(S) : Oyamada et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 457 days.

Signed and Sealed this

Fourteenth Day of December, 2010

David J. Kappos  
*Director of the United States Patent and Trademark Office*